(12) United States Patent
Geissler et al.

(10) Patent No.: US 10,522,485 B2
(45) Date of Patent: Dec. 31, 2019

(54) ELECTRICAL DEVICE AND A METHOD FOR FORMING AN ELECTRICAL DEVICE

(71) Applicant: Intel IP Corporation, Santa Clara, CA (US)

(72) Inventors: Christian Geissler, Teugn (DE); Sven Albers, Regensburg (DE); Georg Seidemann, Landshut (DE); Andreas Wolter, Regensburg (DE); Klaus Reingruber, Langquaid (DE); Thomas Wagner, Regelsbach (DE); Marc Dittes, Regensburg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/776,474

(22) PCT Filed: Dec. 21, 2015

(86) PCT No.: PCT/IB2015/059833
§ 371 (c)(1),
(2) Date: May 16, 2018

(87) PCT Pub. No.: WO2017/109537
PCT Pub. Date: Jun. 29, 2017

(65) Prior Publication Data
US 2018/0331053 A1  Nov. 15, 2018

(51) Int. Cl.
*H01L 23/52*  (2006.01)
*H01L 23/00*  (2006.01)
(Continued)

(52) U.S. Cl.
CPC .......... *H01L 24/02* (2013.01); *H01L 21/768* (2013.01); *H01L 23/525* (2013.01);
(Continued)

(58) Field of Classification Search
CPC ............ H01L 21/768; H01L 23/53238; H01L 23/53252; H01L 24/02; H01L 24/03; H01L 24/05
(Continued)

(56) References Cited

U.S. PATENT DOCUMENTS 7,170,170 B2 *  1/2007  Yeo .................... H01L 24/03
                                                      257/737
7,508,082 B2 *  3/2009  Takewaki ............ H01L 24/03
                                                      257/750
(Continued)

FOREIGN PATENT DOCUMENTS

KR  10-2012-0093588 A  8/2012

*Primary Examiner* — Luan C Thai
(74) *Attorney, Agent, or Firm* — 2SPL Patent Attorneys PartG mbB; Kieran O'Leary

(57) ABSTRACT

An electrical device includes a redistribution layer structure, an inter-diffusing material contact structure and a vertical electrically conductive structure located between the redistribution layer structure and the inter-diffusing material contact structure. The vertical electrically conductive structure includes a diffusion barrier structure located adjacently to the inter-diffusing material contact structure. Further, the diffusion barrier structure and the redistribution layer structure comprise different lateral dimensions.

25 Claims, 11 Drawing Sheets

(51) Int. Cl.
*H01L 21/768* (2006.01)
*H01L 23/525* (2006.01)
*H01L 23/532* (2006.01)

(52) U.S. Cl.
CPC .. *H01L 23/53238* (2013.01); *H01L 23/53252* (2013.01); *H01L 24/03* (2013.01); *H01L 24/05* (2013.01); *H01L 2224/0239* (2013.01); *H01L 2224/02311* (2013.01); *H01L 2224/02331* (2013.01); *H01L 2224/0345* (2013.01); *H01L 2224/03464* (2013.01); *H01L 2224/05008* (2013.01); *H01L 2224/05017* (2013.01); *H01L 2224/05111* (2013.01); *H01L 2224/05124* (2013.01); *H01L 2924/0105* (2013.01); *H01L 2924/01022* (2013.01); *H01L 2924/01028* (2013.01); *H01L 2924/01029* (2013.01); *H01L 2924/01047* (2013.01); *H01L 2924/01049* (2013.01); *H01L 2924/01074* (2013.01)

(58) Field of Classification Search
USPC .......................................................... 257/751
See application file for complete search history.

(56) References Cited

U.S. PATENT DOCUMENTS

| | | | |
|---|---|---|---|
| 8,022,543 B2* | 9/2011 | Farooq | H01L 24/11 257/734 |
| 8,178,953 B2* | 5/2012 | Barth | H01L 21/568 257/659 |
| 8,580,679 B2* | 11/2013 | Dubin | H01L 21/288 438/652 |
| 9,377,502 B2* | 6/2016 | Roehner | G01R 19/0092 |
| 9,536,847 B2* | 1/2017 | Wei | H01L 24/13 |
| 2005/0224991 A1 | 10/2005 | Yeo | |
| 2007/0045836 A1* | 3/2007 | Kwon | H01L 27/76898 257/734 |
| 2011/0084387 A1 | 4/2011 | Dubin et al. | |
| 2012/0205797 A1* | 8/2012 | Bae | H01L 23/49816 257/737 |
| 2014/0078704 A1 | 3/2014 | Andry et al. | |
| 2015/0024554 A1 | 1/2015 | Sapone | |

\* cited by examiner

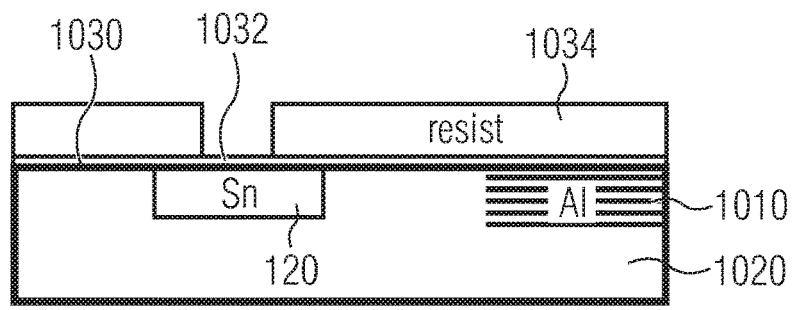
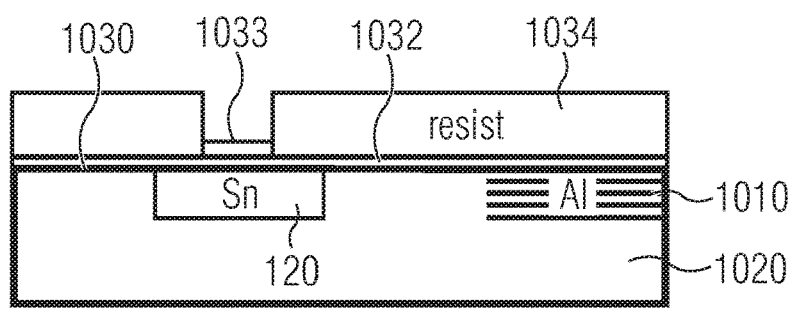
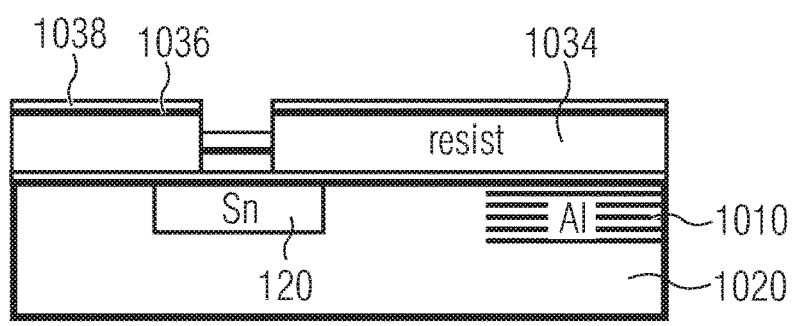
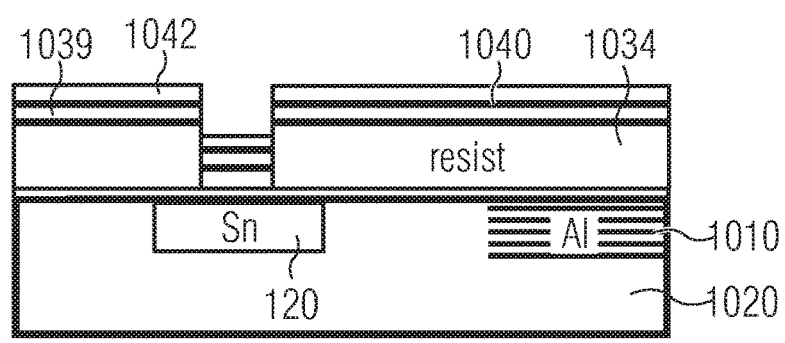
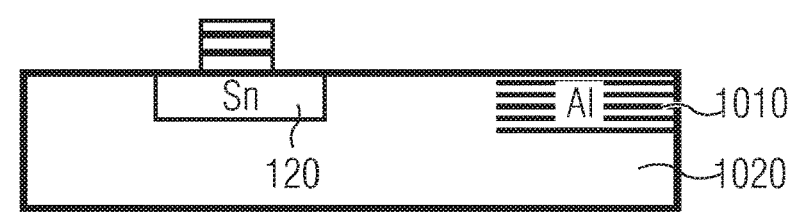

ELECTRICAL DEVICE AND A METHOD FOR FORMING AN ELECTRICAL DEVICE

TECHNICAL FIELD

The present disclosure relates to contact interfaces of electrical devices and in particular to an electrical device and a method for forming an electrical device.

BACKGROUND

The electrical connection between different electrical devices may be implemented in various ways. Independent from the actual implementation, a reliable electrical connection is desired throughout the lifetime of the device. For example, package in package integration and integration of passive components into packages using Cu-redistribution layers like FO-WLB (fan-out wafer level ball grid array package) and FO-Panel (fan-out panel) technologies use a direct contacting of solder pads or solder balls via sputtered or plated Cu contacts or lines. Reliability problems can occur at the contact area because the diffusion barrier liner on top of the Sn surface tends to be leaky. Sn and Cu diffusion processes can appear during high temperature storage or operation temperature and can lead to voids at the contact interface and finally to contact opens during lifetime. An improvement of the reliability of inter-connects may be desired.

BRIEF DESCRIPTION OF THE FIGURES

Some examples of apparatuses and/or methods will be described in the following by way of example only, and with reference to the accompanying figures, in which

FIG. 10A-10G show schematic cross sections of a part of an electrical device at different stages of a manufacturing process;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or electrical device components, but do not preclude the presence or addition of one or more other features, integers, steps, operations, elements, electrical device components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

For example, for FO-WLB technologies a Cu-RDL may be used. The Cu may be plated or sputtered on a liner/seed layer-stack. The liner can provide good adhesion of Cu to the layer below and work as a diffusion barrier for Cu. This may be necessary e.g. for contacting an Al-pad of a silicon die. The Cu-seed layer may be generated by sputtering or by an eless Cu-deposition or lamination process.

Figure 12:
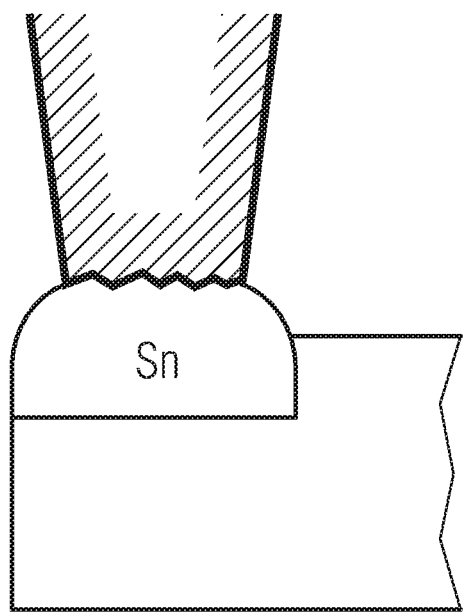
FIG. 12 shows a schematic cross section of a part of an electrical device with a leaky barrier layer between a copper contact and a tin pad.
Figure 13:
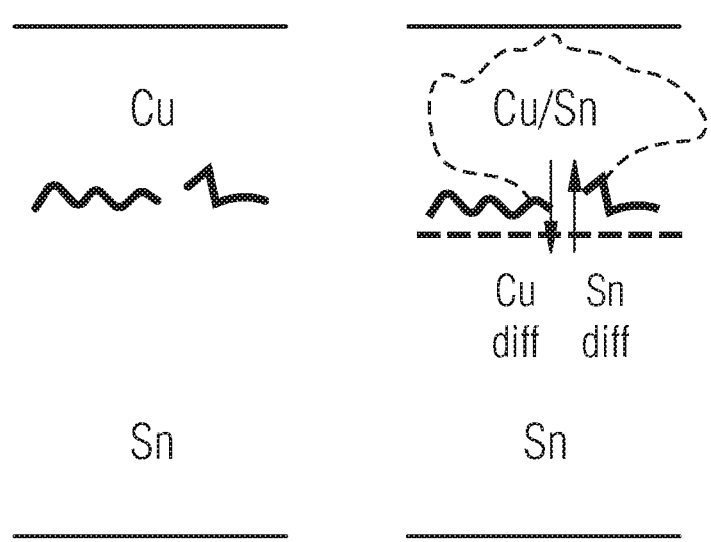
FIG. 13 shows two schematic cross sections of a part of an electrical device comparing the diffusion of copper and tin through a leaky barrier layer initially and after high temperature storage.

For example, contacting a Sn-pad may be challenging because the Sn-surface has a high roughness which may lead to a leaky barrier layer (e.g. FIG. 12) which cannot prevent Cu and Sn diffusion during higher temperatures (e.g. FIG. 13). This may lead to voids at the Cu/Sn interface and in worst case to an electrically open contact. The interface voids may be mainly created by voids in the Sn surface.

Avoiding or limiting the Sn diffusion may enable an improvement. FIG. 12 shows a Cu contact to Sn-pad with leaky barrier. The diffusion barrier may comprise local barrier voids or thinning. A comparison of Cu and Sn initially and after high temperature storage is shown in FIG. 13. The void appearance may lead to starting Sn/Cu delamination and the contact resistance $R_{cont}$ may increase up to contact opens.

Figure 14A:
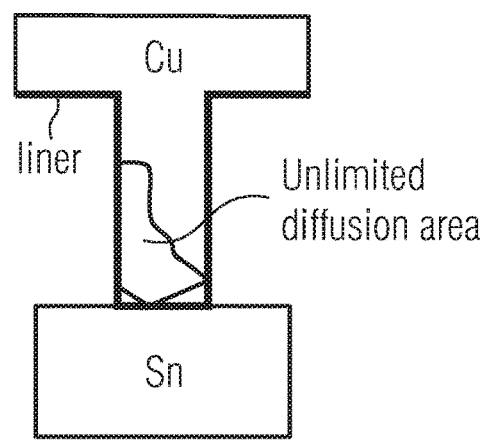
FIG. 14A-14C show schematic cross sections of different examples of vertical connections with large diffusion.
Figure 14B:
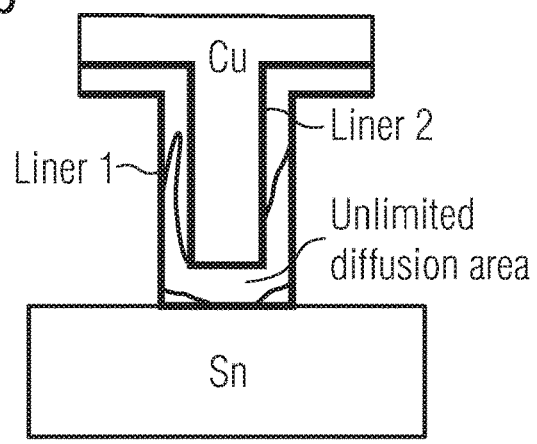
Figure 14C:
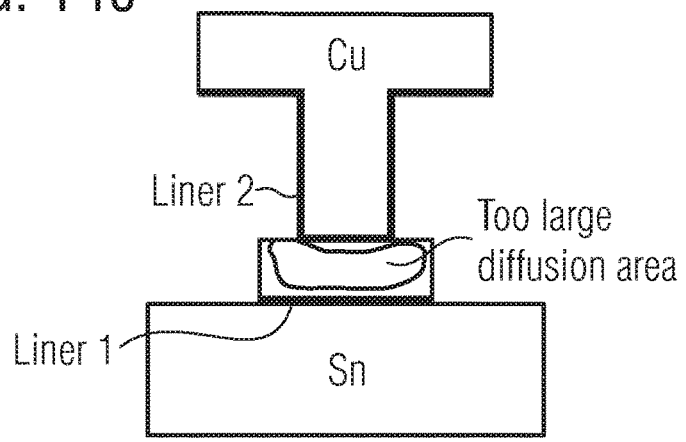

For example, direct contact of the Cu-RDL via the liner to the Sn-pad surface as shown in FIG. 14A should be avoided. Further, offering a too big diffusion volume either due to the lateral dimension as shown in FIG. 14B or due to the Cu thickness as shown in FIG. 14C should be avoided, for example. An improvement of the reliability of interconnects may be desired.

Figure 1:
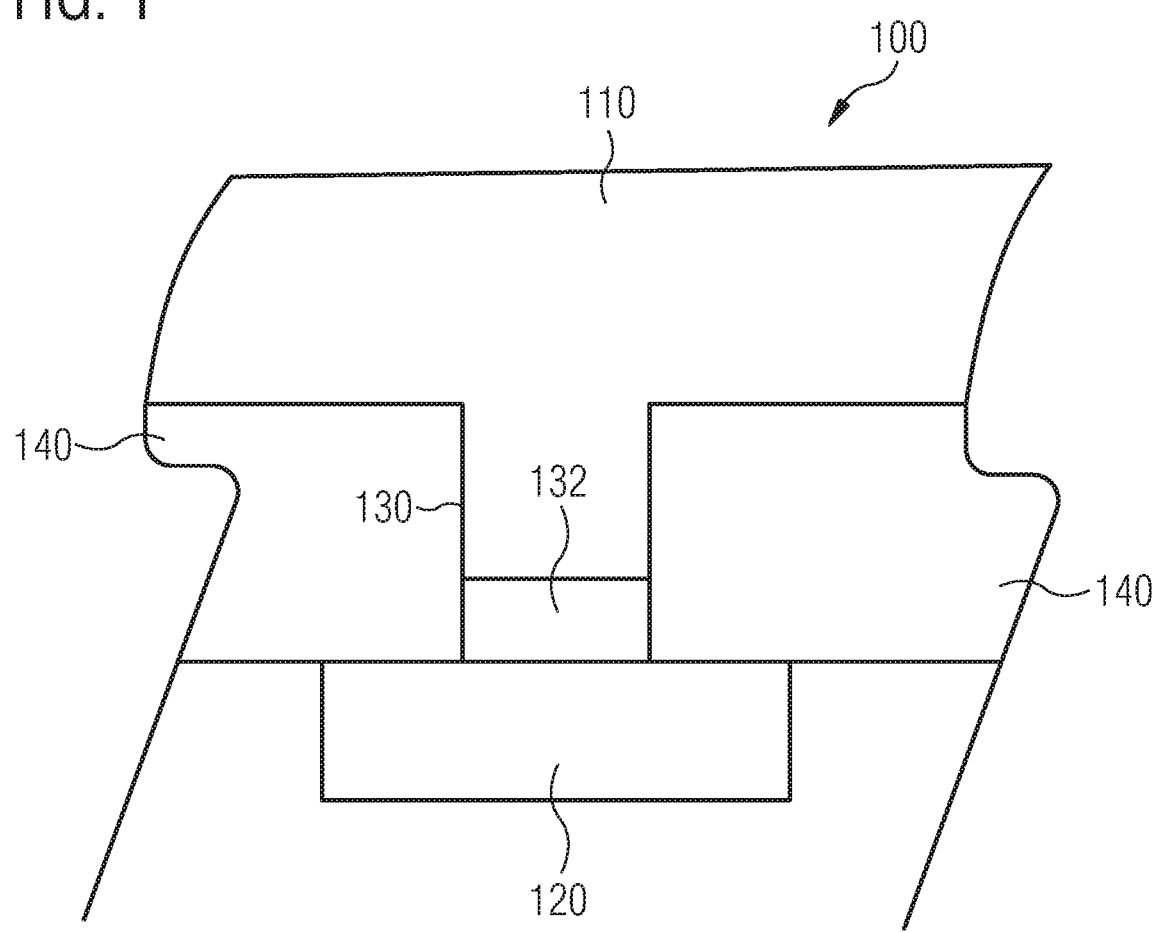
FIG. 1 shows a schematic cross section of a part of an electrical device.

FIG. 1 shows a schematic cross section of a part of an electrical device 100 according to an example. The electrical device 100 includes a redistribution layer structure 110, an inter-diffusing material contact structure 120 and a vertical electrically conductive structure 130 located between the redistribution layer structure 110 and the inter-diffusing material contact structure 120. The vertical electrically conductive structure 130 includes a diffusion barrier structure 132 located adjacently to the inter-diffusing material contact structure 120. Further, the diffusion barrier structure 132 and the redistribution layer structure 110 comprise different lateral dimensions.

By implementing a diffusion barrier structure between the redistribution layer structure and the inter-diffusing material contact structure independent from the redistribution layer structure, a diffusion of material of the inter-diffusing material contact structure into the redistribution layer structure may be significantly reduced or completely avoided. In this way, voids at the surface of the inter-diffusing material contact structure may be reduced or avoided, which can reduce the risk of delaminations and/or open contacts. The reliability of the electrical conductive connection between the redistribution layer structure and the inter-diffusing material contact structure may be improved.

The inter-diffusing material contact structure 120 may be a solder interface (e.g. chip pad, lead or contact interface) of an electrical component (e.g. a semiconductor device, an integrated passive device or a surface mountable device, for example, a central processing unit CPU, a memory device, a transmitter device, a receiver device, a transceiver device, a capacitor or an inductor). The inter-diffusing material contact structure 120 may comprise a lateral dimension of more than 50 µm (or more than 100 µm, more than 500 µm or more than 1 mm) or a lateral surface area of more than 50 µm×50 µm (or more than 100 µm×100 µm, more than 500 µm×500 µm or more than 1 mm×1 mm). For example, a lateral direction or lateral dimension (x or y dimension) may be in parallel to a contact surface of the inter-diffusing material contact structure 120 and a vertical direction or vertical dimension (z height) may be orthogonal to the contact surface of the inter-diffusing material contact structure 120. The inter-diffusing material contact structure 120 comprises material (e.g. tin), which would diffuse into at least a portion (e.g. copper layer) of the redistribution layer structure 110 in absence of a diffusion barrier. For example, the inter-diffusing material contact structure 120 may comprise or is a material with a melting temperature of less than 400° C. (e.g. soft solder) in contact with the diffusion barrier structure 132. For example, the inter-diffusing material contact structure 120 may be a tin contact structure comprising a tin-based alloy (e.g. more than 40% or more than 89% tin) or an indium contact structure comprising an indium based alloy (e.g. more than 40% indium) at a surface in contact with the diffusion barrier structure 130.

The redistribution layer structure 110 enables electrical connections between the electrical component comprising the inter-diffusing material contact structure 120 and one or more other electrical components in the same package, one or more external devices and/or a printed circuit board. The redistribution layer structure 110 may comprise at least one structured low-ohmic redistribution layer (e.g. a metal layer, for example, a copper layer or a silver layer) implementing metal lines for routing. The structured low-ohmic redistribution layer may be embedded in electrically insulating material (e.g. poly imide, silicon oxide or silicon nitride). The low-ohmic redistribution layer may comprise mainly (e.g. more than 70%, more than 90% or more than 95%) copper (or silver). For example, the structured low-ohmic redistribution layer comprises a thickness of more than 2 µm (or more than 5 µm or more than 10 µm). More than one structured low-ohmic redistribution layer (multi-layer redistribution structure) may be used for more complex routing. Further, the redistribution layer structure 110 may comprise a diffusion barrier layer structured simultaneously with the low-ohmic redistribution layer. Consequently, the diffusion barrier layer and the low-ohmic redistribution layer of the redistribution layer structure 110 may comprise equal lateral dimensions due to the simultaneous structuring. The diffusion barrier layer of the redistribution layer structure 110 may be an insufficient barrier against the diffusion of the material of the inter-diffusing material contact structure 120 without the diffusion barrier structure 132. The redistribution layer structure 110 may be a redistribution layer structure of a fan-out wafer-level package, a fan-out panel package or a wafer level chip scale package.

The electrical device 100 may be a central processing unit CPU, a memory device, a transmitter device, a receiver device, a transceiver device or a system in package device or package in package devices comprising a combination of one or more components as a semiconductor device, an integrated passive device IPD and/or a surface mountable device SMD, for example, a central processing unit CPU, a memory device, a transmitter device, a receiver device, a transceiver device, a capacitor and/or an inductor. The electrical device 100 may comprise a fan-out wafer-level package, a fan-out panel package or a wafer level chip scale package.

The vertical electrically conductive structure 130 forms an electrical conductive connection between the inter-diffusing material contact structure 120 and a structured low-ohmic redistribution layer of the redistribution layer structure 110, for example. The vertical electrically conductive structure 130 extends vertically through an insulation layer 140 (e.g. poly imide, silicon oxide or silicon nitride). For example, the insulation layer 140 insulates the structured low-ohmic redistribution layer from the inter-diffusing material contact structure 120 outside the vertical electrically conductive structure 130. The vertical electrically conductive structure 130 may comprise a vertical dimension of more than 1 µm (or more than 10 µm or more than 50 µm). The vertical electrically conductive structure 130 comprises at least the diffusion barrier structure 132. The diffusion barrier structure 132 may extend over the whole height of the vertical electrically conductive structure 130 (e.g. FIG. 6). Alternatively, an upper part of the vertical electrically conductive structure is formed by a vertical extension of the redistribution layer structure (e.g. FIG. 2). The upper part may be a portion of the vertical electrically conductive structure 130 located at a side of the diffusion barrier structure 132 opposite to the inter-diffusing material contact structure 120.

The diffusion barrier structure 132 is in contact with the inter-diffusing material contact structure 120. The diffusion barrier structure 132 comprises at least one layer, which reduces or suppresses a diffusion of material of the inter-diffusing material contact structure 120 into the redistribution layer structure 110 or vice versa. The diffusion barrier structure 132 comprises a lateral dimension different from the redistribution layer structure 110, in contrast to a diffusion barrier layer formed or structured together with the low-ohmic redistribution layer of the redistribution layer structure 110. Therefore, one or more materials and/or the geometry of the diffusion barrier structure 132 can be selectable independent from the redistribution layer structure 110 to significantly reduce the diffusion. For example, the diffusion barrier structure 132 is deposited and structured before the deposition and structuring of the redistribution layer structure 110. For example, different masks are used for the structuring of the redistribution layer structure 110 and the diffusion barrier structure 132.

For example, the diffusion barrier structure 132 may be arranged between a diffusion barrier layer of the redistribution layer structure 110 and the inter-diffusing material contact structure 120 to avoid a direct interface between the diffusion barrier layer of the redistribution layer structure 110 and the inter-diffusing material contact structure 120. A direct interface between the diffusion barrier layer of the redistribution layer structure 110 and the inter-diffusing material contact structure 120 may be undesired, since the diffusion barrier layer of the redistribution layer structure 110 may be leaky due to a high surface roughness of the inter-diffusing material contact structure 120 (e.g. tin comprises a high surface roughness). The surface roughness of the contact interface of the diffusion barrier structure 132 towards the redistribution layer structure 110 may be significantly less rough. For example, a surface roughness (e.g. average roughness $R_a$) of a surface of the inter-diffusing material contact structure 120 located adjacently to the diffusion barrier structure 132 may be higher than a surface roughness of a surface of the diffusion barrier structure 132 located adjacently to the redistribution layer structure 110. For example, the surface roughness of the inter-diffusing material contact structure 120 is more than 20% (or more than 50%, more than 80% or more than 150%) higher than the surface roughness of the surface of the diffusion barrier structure 132.

The diffusion barrier structure 132 may comprises a thickness of more than 500 nm (or more than 1 µm, more than 5 µm or more than 10 µm). The thickness may be a vertical dimension of the diffusion barrier structure 132 (e.g. orthogonal to a surface of the inter-diffusing material contact structure).

The diffusion barrier structure 132 may be implemented in various ways. For example, the diffusion barrier structure 132 may comprise at least one diffusion barrier layer and at least one copper or silver layer. The at least one copper or silver layer comprises a thickness of less than 500 nm. For example, the at least one diffusion barrier layer of the diffusion barrier structure 132 may be a titanium-tungsten TiW layer. The diffusion barrier structure 132 may comprise a layer stack of alternating diffusion barrier layers and copper or silver layers (e.g. FIG. 7). For example, a volume of copper or silver of a lowermost copper or silver layer of the diffusion barrier structure located between a lowermost diffusion barrier layer and an opposite diffusion barrier layer may be less than $1*10^{-4}$ cm$^3$ per cm$^2$ (or less than $5*10^{-5}$ cm$^3$ per cm$^2$). In this way, the volume of copper or silver available for the inter-diffusion of material of the inter-diffusing material contact structure 120 passing the lowermost diffusion barrier layer may be very limited. In this way, a generation of large voids or delaminations may be avoided.

Alternatively, the diffusion barrier structure 132 may comprise or may be a nickel based layer (e.g. more than 30%, more than 50% or more than 80% nickel).

Optionally, the electrical device 100 may comprise a second contact structure (e.g. aluminum pad) comprising a material different from a material of the inter-diffusing material contact structure 120. A vertical extension of the redistribution layer structure implementing a via may be in direct contact with the second contact structure. An additional diffusion barrier structure may be unnecessary due to a less inter-diffusing material of the second contact structure or a less rough surface of the second contact structure. For example, the second contact structure may comprise mainly aluminum at a surface in contact with the vertical extension of the redistribution layer structure. The second contact structure may be a contact interface (e.g. pad or lead) of another electrical component of the electrical device 100, of a through silicon via or a through mold via, for example. The inter-diffusing material contact structure 120 may form a contact interface of a first electrical component and the second contact structure may form a contact interface of a second device component arranged in a mutual package of the electrical device 100.

Figure 2:
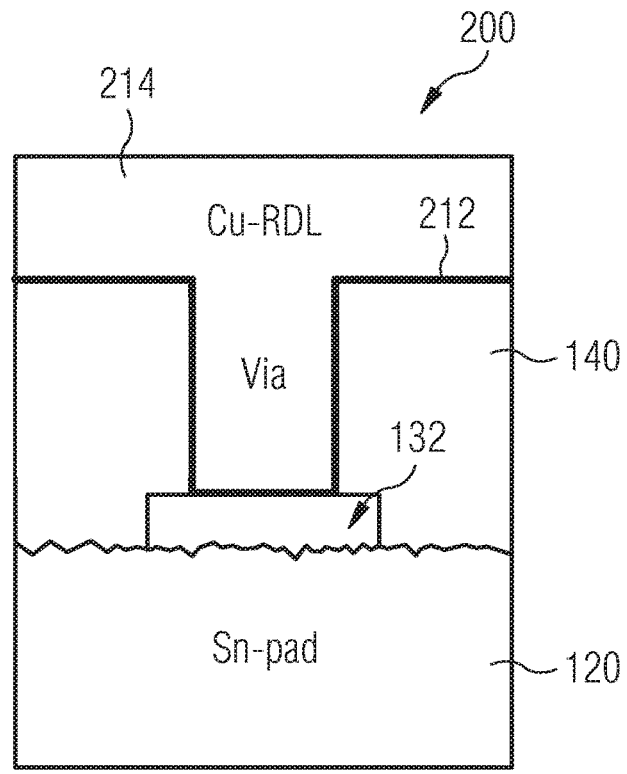
FIG. 2 shows a schematic cross section of a part of an electrical device with Cu-RDL and Sn-pad.

FIG. 2 shows a schematic cross section of a part of an electrical device 200 with a copper redistribution layer structure Cu-RDL and a tin Sn-pad according to an example. The diffusion barrier structure 132 (e.g. low-ohmic diffusion barrier block) is in contact with the rough Sn surface of the tin pad 120 at one side and in contact with the diffusion barrier layer 212 (e.g. titanium-tungsten layer) of the redistribution layer structure, also called redistribution layer RDL liner, at an opposite side. Further, the redistribution layer structure comprises a structured low-ohmic copper redistribution layer 214. The vertical electrically conductive structure (via) is formed by the diffusion barrier structure 132 and a vertical extension of the redistribution layer structure forming the upper part of the via. A dielectric layer 140 separates the redistribution layer structure from the Sn-pad outside the via. In this example, a lateral dimension of the diffusion barrier structure 132 is larger than a lateral dimension of the upper part of the vertical electrically conductive structure. The diffusion barrier block overlaps the Cu via on both or all sides. In this way, manufacturing tolerances may be compensated so that the redistribution layer structure does not get in direct contact with the tin pad 120 at the edges of the diffusion barrier structure 132.

A direct contact of Cu-RDL via liner to the Sn-pad surface (e.g. FIG. 14A) may be avoided by introducing an additional low ohmic diffusion barrier block between RDL-Cu and Sn contact area. For example, the implementations shown in FIG. 1-8 avoid a direct diffusion path between Sn-pad and Cu-RDL.

For example, the width $W_{dbb}$ of the diffusion barrier block may be defined as:

$$W_{dbb} > W_{via} + \text{SQRT}(\text{Tolerance}_{max}(W_{via})^2 + (2* \text{Overlay}_{max}(\text{via, dbb}))^2 + \text{Tolerance}_{max}(W_{dbb})^2)$$

$W_{dbb}$ is the width of the diffusion barrier structure, $W_{via}$ is the width of the vertical extension (upper portion of via) of the redistribution layer structure, $\text{Tolerance}_{max}(W_{via})$ is the maximal manufacturing tolerance of $W_{via}$ and Overlay$_{max}$(via, dbb) is the maximal overlay of the diffusion barrier structure and the vertical extension.

The vertical dimension (Z-height) may be in the range of 0.5-3 µm, for example.

More details and aspects are mentioned in connection with the examples described above or below. The example shown in FIG. 2 may comprise one or more optional additional features corresponding to one or more aspects mentioned in connection with the proposed concept or one or more examples described above (e.g. FIG. 1) or below (e.g. FIG. 3-11).

Figure 3:
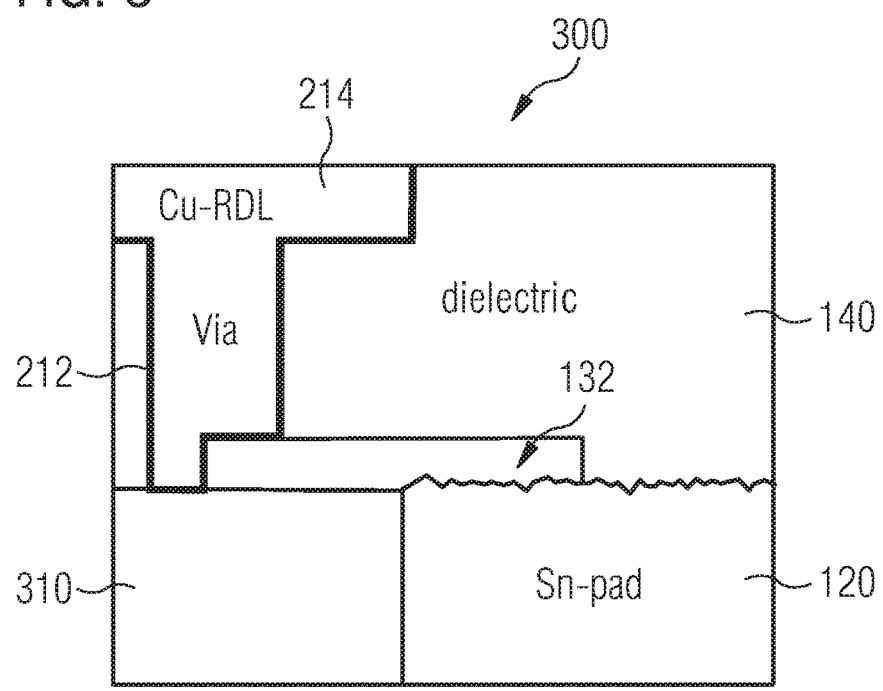
FIG. 3 shows a schematic cross section of a part of an electrical device with a lateral offset via.

FIG. 3 shows a schematic cross section of a part of an electrical device 300 with a lateral offset via according to an example. The implementation of the electrical device 300 is similar to the implementation shown in FIG. 2. The diffusion barrier structure 132 is in contact with the tin surface of the tin pad 120 at one lateral end portion of the diffusion barrier structure 132 and in contact with the diffusion barrier layer 212 of the redistribution layer structure at another lateral end portion of the diffusion barrier structure 132. For example, a contact area between the diffusion barrier structure 132 and the vertical electrically conductive structure (via) and a contact area between the diffusion barrier structure 132 and the inter-diffusing material contact structure 120 may comprise no overlap in a top view. In this way, a lateral distance between the via and the Sn-pad may be bridged by the diffusion barrier structure 132. The diffusion barrier block may form a bridge between the Sn-pad and the Cu-via. Further, the via may be located at an edge of the diffusion barrier structure 132 with a portion of the via located laterally outside the diffusion barrier structure 132. For example, the bottom of the via may be in contact with an insulation layer 310 (e.g. molding compound, a passivation layer, a silicon oxide layer or silicon nitride layer) outside the diffusion barrier structure 132. For example, an outside portion of a footprint of the upper part of the vertical electrically conductive structure may be located outside of a footprint of the diffusion barrier structure 132 and outside a footprint of the inter-diffusing material contact structure 120.

FIG. 3 may show a construction where the diffusion barrier block is used as lateral bridge between Sn-pad area and Non-Sn-pad area. The RDL-Cu via then can be completely or partially placed on the diffusion barrier block. Partially placing may be possible if the via is not touching any Sn-area, for example.

More details and aspects are mentioned in connection with the examples described above or below. The example shown in FIG. 3 may comprise one or more optional additional features corresponding to one or more aspects mentioned in connection with the proposed concept or one or more examples described above (e.g. FIG. 1-2) or below (e.g. FIG. 4-11).

Figure 4:
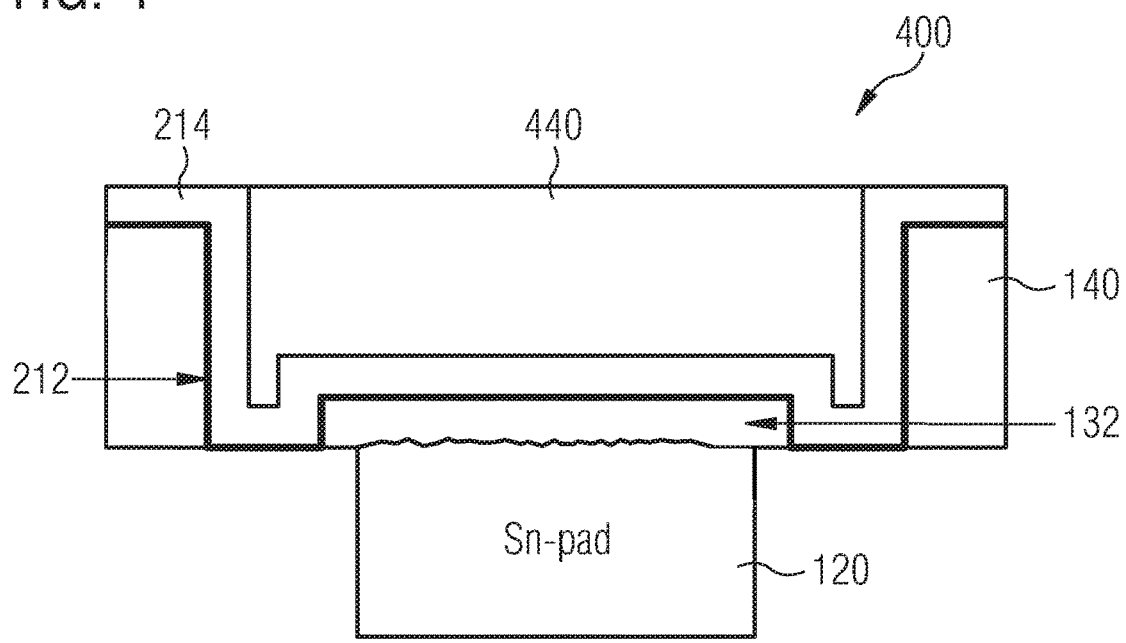
FIG. 4 shows a schematic cross section of a part of an electrical device with laterally covering diffusion barrier structure.

FIG. 4 shows a schematic cross section of a part of an electrical device 400 with laterally covering diffusion barrier structure according to an example. The implementation of the electrical device 400 is similar to the implementation shown in FIG. 2. However, the diffusion barrier structure 132 laterally covers the whole inter-diffusing material contact structure 120 (Sn-pad surface). Further, a bottom of the upper portion (Cu via) of the vertical electrically conductive structure comprises a larger lateral dimension than the diffusion barrier structure 132. For example, the bottom of the via may be in contact with an insulation layer 310 (e.g. molding compound, a passivation layer, a silicon oxide layer or silicon nitride layer) outside the diffusion barrier structure 132 and outside the Sn-pad.

In FIG. 4, the diffusion barrier block is completely covering the Sn-pad area including a certain overlap. The RDL-Cu-Via can be placed in the center like in FIG. 2 or placed at the edge like FIG. 3 or instead of a small via a large or oblong via can be used which overlaps on all or two sides. Alternatively, the RDL-Cu-Via may be implemented with an offset to the center.

More details and aspects are mentioned in connection with the examples described above or below. The example shown in FIG. 4 may comprise one or more optional additional features corresponding to one or more aspects mentioned in connection with the proposed concept or one or more examples described above (e.g. FIG. 1-3) or below (e.g. FIG. 5-11).

Figure 5:
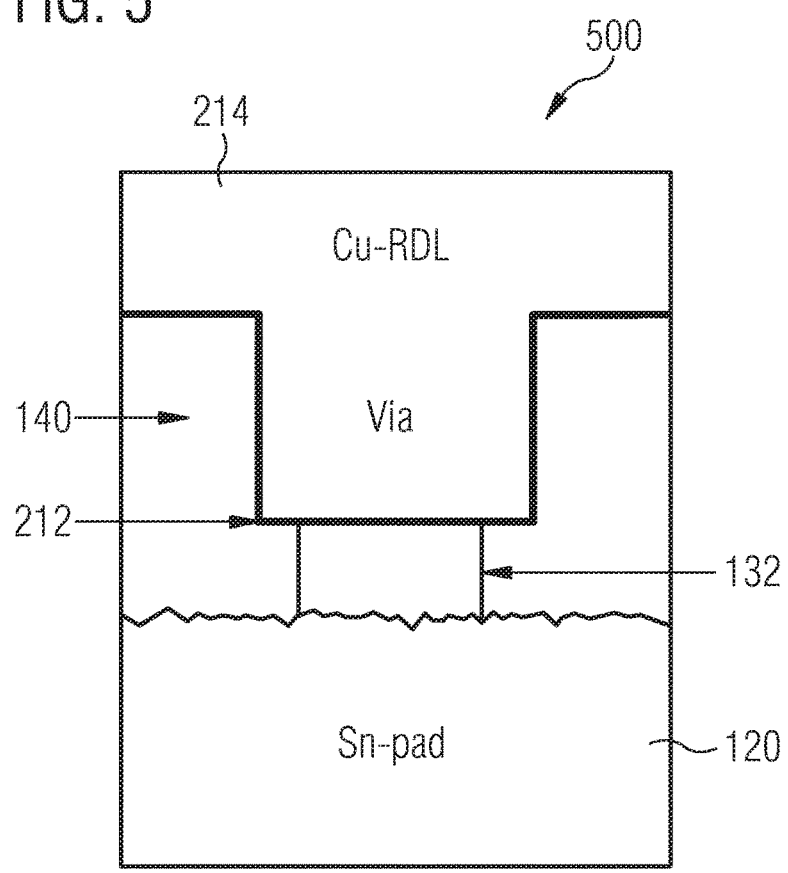
FIG. 5 shows a schematic cross section of a part of an electrical device with thick diffusion barrier structure.

FIG. 5 shows a schematic cross section of a part of an electrical device 500 with thick diffusion barrier structure according to an example. The implementation of the electrical device 500 is similar to the implementation shown in FIG. 2. However, the bottom of the upper portion (Cu via) of the vertical electrically conductive structure comprises a larger lateral dimension than the diffusion barrier structure 132. In order to avoid a direct contact of the Cu via with the Sn-pad, the diffusion barrier structure 132 is implemented with large thickness. For example, the diffusion barrier structure 132 may comprise a vertical dimension of more than 10 µm (or more than 50 µm). A portion of the insulation layer 140 is located between a portion of the bottom of the upper portion extending outside the diffusion barrier structure 132 and the Sn-pad. For example, a thick diffusion barrier block underlapping the Cu-via on one or both sides (or all sides) of the via is implemented. The via overlap area is separated from the Sn-area by a dielectric material 140.

In FIG. 5, the RDL-via may overlap the diffusion barrier block if the remaining dielectric thickness outside of the block is thick enough to ensure Cu/Sn diffusion blocking over the full process window. The electrical conduction is limited to the diffusion barrier block area, for example. The diffusion barrier structure may comprise a thickness between 3-5 µm, for example. By a further increase of the diffusion barrier block thickness, the Cu-RDL via may be completely replaced (e.g. FIG. 6).

More details and aspects are mentioned in connection with the examples described above or below. The example shown in FIG. 5 may comprise one or more optional additional features corresponding to one or more aspects mentioned in connection with the proposed concept or one or more examples described above (e.g. FIG. 1-4) or below (e.g. FIG. 6-11).

Figure 6:
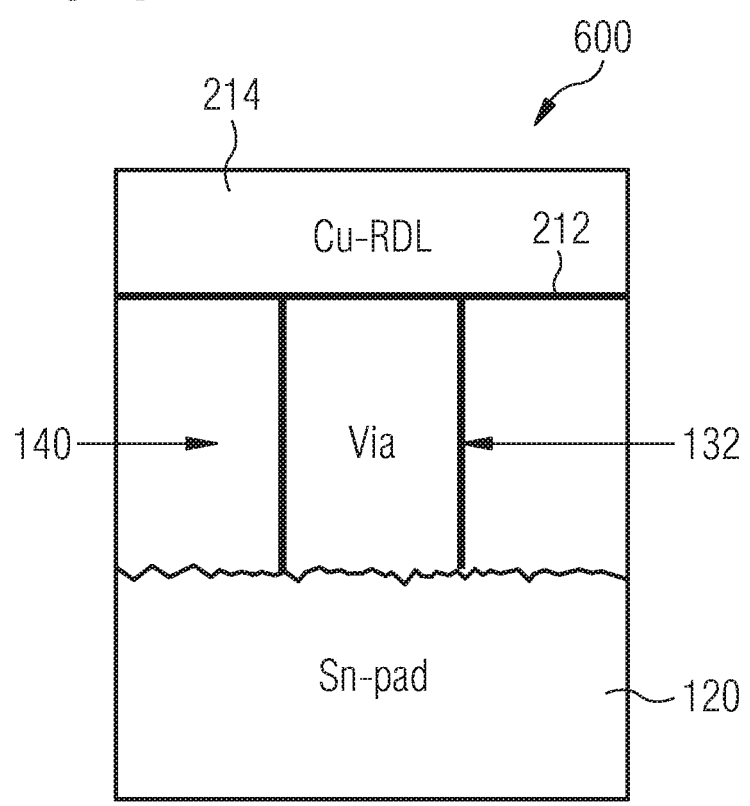
FIG. 6 shows a schematic cross section of a part of an electrical device with a diffusion barrier structure forming the via.

FIG. 6 shows a schematic cross section of a part of an electrical device 600 with a diffusion barrier structure forming the via according to an example. The implementation of the electrical device 600 is similar to the implementation shown in FIG. 5. However, the diffusion barrier structure 132 implements the complete vertical electrically conductive structure. The redistribution layer structure is implemented without vertical extension for forming a portion of the via. For example, a thick barrier block replaces the Cu-via.

Via and diffusion barrier block resistance may be impacted by the choice of the barrier material, z-height and lateral dimension. Sn-contact areas like solder pads may have a large lateral dimension compared to an RDL-via diameter. Changing (enlarging) the via diameter may help to adjust the via contact resistance if required. For example, the selection of a suitable barrier material is also impacted by the electrical conductivity.

More details and aspects are mentioned in connection with the examples described above or below. The example shown in FIG. 6 may comprise one or more optional additional features corresponding to one or more aspects mentioned in connection with the proposed concept or one or more examples described above (e.g. FIG. 1-5) or below (e.g. FIG. 7-11).

Figure 7:
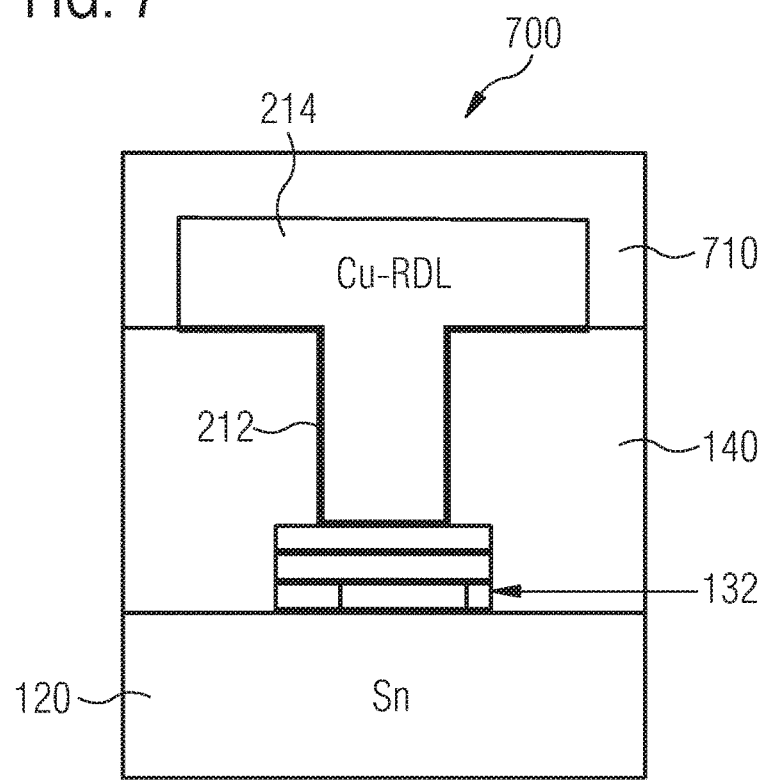
FIG. 7 shows a schematic cross section of a part of an electrical device with a diffusion barrier structure comprising a stack of copper and barrier layers.

FIG. 7 shows a schematic cross section of a part of an electrical device with a diffusion barrier structure comprising a stack of copper and barrier layers according to an example. For example, the diffusion barrier is implemented by a multiple liner/Cu stack (e.g. three times TiW/Cu stack). In this way, only a limited diffusion area may be provided in the diffusion barrier structure for a diffusion of the tin (e.g. indicated in the lowermost Cu layer of the layer stack). The vertical electrically conductive structure comprising the diffusion barrier structure 132 and the Cu via reaches vertically through a first dielectric layer 140 and the structured Cu redistribution layer is embedded in a second dielectric layer 710. The first dielectric layer 140 may comprise a thickness of more than 2 μm (or more than 5 μm or more than 10 μm) and the second dielectric layer 710 may comprise a thickness of more than 2 μm (or more than 5 μm or more than 10 μm). The redistribution layer structure is in contact with the diffusion barrier structure 132 on top of the diffusion barrier block with 3× liner/Cu.

For example, the liner will not be leaky, if the surface is smooth as a plated or sputtered Cu-surface. This may be achieved by introducing a heterogeneous stack of e.g. 3TiW/Cu stacks. Even if the first liner is still leaky, the following ones or at least one of the following ones will not be leaky and therefore the diffusion may be limited. The liner stacking may be designed in a way that the possible Cu diffusion volume is limited to a small fixed volume. This may define the possible impact by Cu/Sn-diffusion on the Cu/Sn-Interface. The limitation of the Cu/Sn-diffusion areas may depend on the contact constructions. For example, FIG. 14A shows a diffusion volume of a Cu-RDL-contact with a leaky liner over Sn area. FIG. 7 shows a concept to limit the possible Cu/Sn-diffusion volume by introducing a 3 times liner/Cu-stack. The Cu/Sn-diffusion volume may be reduced in a way that voids and delaminations may be avoided. A parameter to adjust (the volume for diffusion) may be the Cu thickness between liner 1 (lowermost liner) and 2 (second lowermost layer) and the lateral dimension (of the diffusion barrier structure). For example, the Cu thickness may be 1 μm or less.

More details and aspects are mentioned in connection with the examples described above or below. The example shown in FIG. 7 may comprise one or more optional additional features corresponding to one or more aspects mentioned in connection with the proposed concept or one or more examples described above (e.g. FIG. 1-6) or below (e.g. FIG. 8-11).

Figure 8:
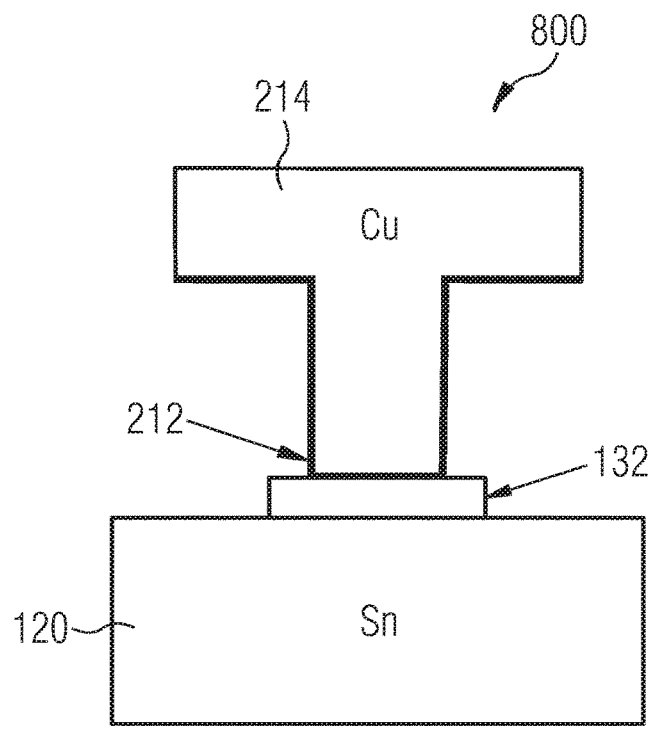
FIG. 8 shows a schematic cross section of a part of an electrical device with a diffusion barrier structure comprising a nickel layer.

FIG. 8 shows a schematic cross section of a part of an electrical device with a diffusion barrier structure comprising a nickel layer according to an example. For example, the diffusion barrier is implemented by an eless (electroless) plated nickel barrier.

For example, an eless plated nickel barrier is formed on the Sn-pad. An (additional) Al-pad may be covered by a deposited and patterned carbon hard mask. Ni can be electrochemical deposited directly on the Sn surface by using a Pd/Ni starting layer, for example. A Ni layer thickness between 1-10 μm (e.g. more than 1, more than 2 or more than 5) may be implemented. In comparison to the liner/Cu-stack construction, the nickel construction may be very stable against Cu and Sn diffusion. A possible process flow is shown in FIG. 11A-11E.

Nickel may be suitable to replace completely the via like it is shown in FIG. 6. The higher resistance value of nickel may be compensated by via diameter increase.

More details and aspects are mentioned in connection with the examples described above or below. The example shown in FIG. 8 may comprise one or more optional additional features corresponding to one or more aspects mentioned in connection with the proposed concept or one or more examples described above (e.g. FIG. 1-7) or below (e.g. FIG. 9-11).

Figure 9:
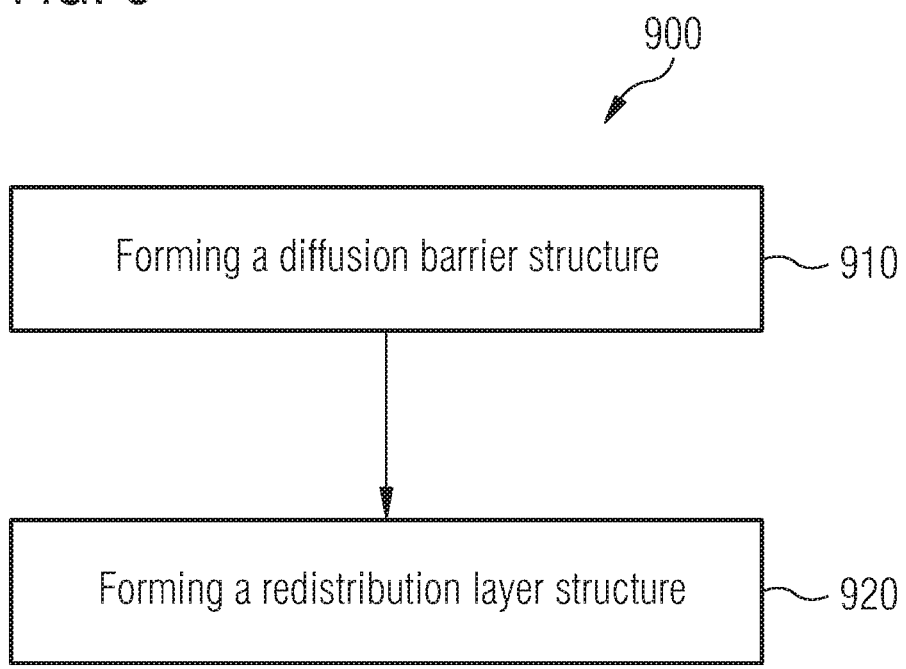
FIG. 9 shows a flow chart of a method for forming an electrical device.

FIG. 9 shows a flow chart of a method for forming an electrical device according to an example. The method 900 comprises forming 910 a diffusion barrier structure adjacently to an inter-diffusing material contact structure based on a first structuring process. Further, the method 900 comprises forming 920 a redistribution layer structure in contact with the diffusion barrier structure based on a second structuring process independent from the first structuring process. The diffusion barrier structure and the redistribution layer structure comprise different lateral dimensions structured by the two independent structuring processes.

By implementing a diffusion barrier structure between the redistribution layer structure and the inter-diffusing material contact structure independent from the redistribution layer structure, a diffusion of material of the inter-diffusing material contact structure into the redistribution layer structure may be significantly reduced or completely avoided. In this way, voids at the surface of the inter-diffusing material contact structure may be reduced or avoided, which can reduce the risk of delaminations and/or open contacts. The reliability of the electrical conductive connection between the redistribution layer structure and the inter-diffusing material contact structure may be improved.

For example, forming 910 the diffusion barrier structure may comprises forming at least one diffusion barrier layer and forming at least one copper or silver layer. The at least one diffusion barrier layer may be a titanium-tungsten layer.

Alternatively, forming 910 the diffusion barrier structure may comprises forming a nickel based layer. Additionally, forming 910 the diffusion barrier structure may further comprise forming a palladium-nickel based seed layer on the inter-diffusing material contact structure before forming the nickel based layer. The nickel based layer may be formed by an electro-less plating process.

More details and aspects are mentioned in connection with the examples described above or below. The example shown in FIG. 9 may comprise one or more optional additional features corresponding to one or more aspects mentioned in connection with the proposed concept or one or more examples described above (e.g. FIG. 1-8) or below (e.g. FIG. 10-11).

Figure 10F:
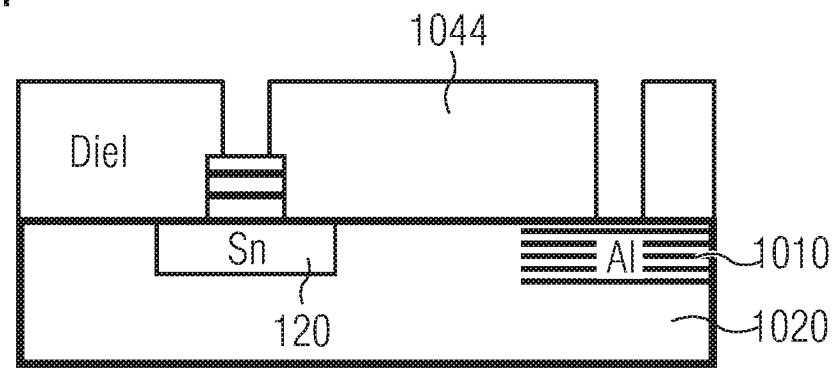
Figure 10F:
Figure 10G:
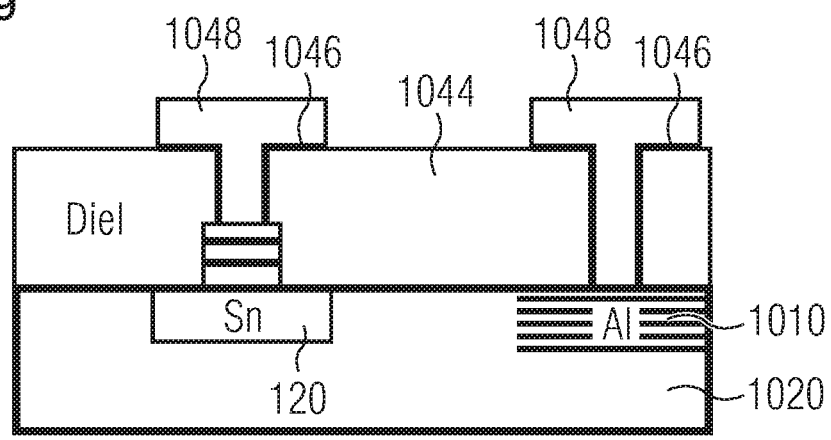

FIG. 10A-10G show schematic cross sections of a part of an electrical device at different stages of a manufacturing process according to an example. A tin Sn pad 120 of an electrical component (e.g. semiconductor device, IPD or SMD) and an aluminum Al pad 1010 of the same or another electrical component is embedded in or surrounded by an electrical insulating structure 1020 (e.g. molding compound, passivation structure and/or inorganic insulating material as oxide or nitride) of a mutual package. A first liner (barrier layer) 1030 and a first copper seed layer 1032 is formed (e.g. at the surface of the pads and the electrical insulating structure). Further, a resist layer 1034 (e.g. photo resist) is formed and structured to define one or more regions for forming a diffusion barrier structure as shown in FIG. 10A. For example, a pre-formed resist layer 1034 (with openings) may be arranged on the first liner 1030 and the first copper seed layer 1032 (e.g. by lamination). Alternatively, the resist layer 1034 is formed before the first liner 1030 and the first copper seed layer 1032. Then, a first copper layer 1033 is formed by a copper plating process as shown in FIG. 10B. FIG. 10C shows a following forming of a second liner 1036 and a second copper Cu seed layer 1038 (e.g. by sputtering). Further, the liner and seed layer formation and the Cu plating are repeated to form a second copper layer 1039, a third liner 1040, a third seed layer and a third copper layer 1042 as shown in FIG. 10D. Then the resist 1034 is lift off (and the first liner and the first Cu seed layer are removed outside the diffusion barrier structure) as shown in FIG. 10E. Afterwards, a dielectric layer 1044 is deposited, exposed during a lithography process and cured in order to obtain holes for the implementation of vertical extensions of the redistribution layer to form vertical connections as shown in FIG. 10F. Further, a diffusion barrier layer 1046 and a copper redistribution layer 1048 are formed and structured by a redistribution layer RDL process block as shown in FIG. 10G.

FIG. 10A-10G may show a possible process flow for integrating a Cu/Sn contact (e.g. as shown in FIG. 7) into an RDL-process and for a robust Cu-RDL-contact on Sn- and Al-Pad in parallel by implementing a 3* Liner/Cu diffusion barrier block.

More details and aspects are mentioned in connection with the examples described above or below. The example shown in FIG. 10A-G may comprise one or more optional additional features corresponding to one or more aspects mentioned in connection with the proposed concept or one or more examples described above (e.g. FIG. 1-9) or below (e.g. FIG. 11).

Figure 11A:
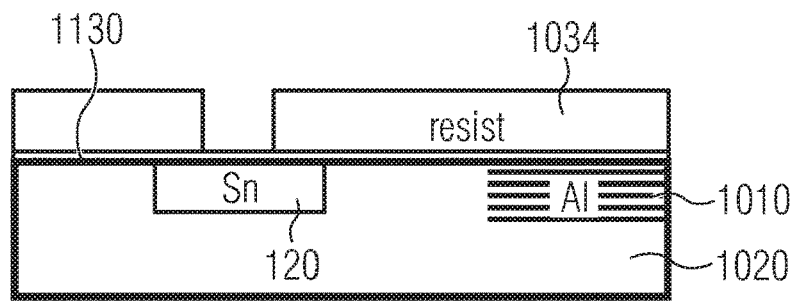
FIG. 11A-11E show schematic cross sections of a part of an electrical device at different stages of another manufacturing process.
Figure 11B:
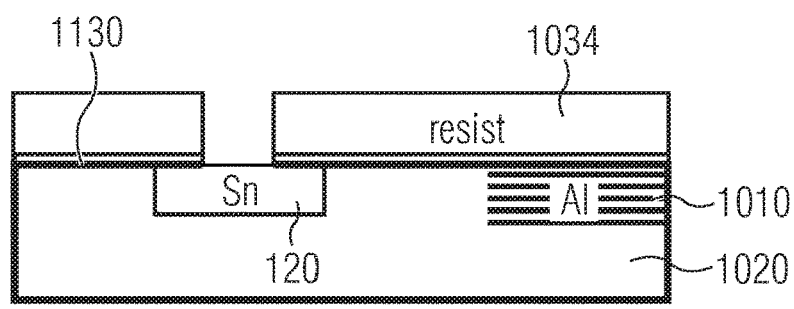
Figure 11C:
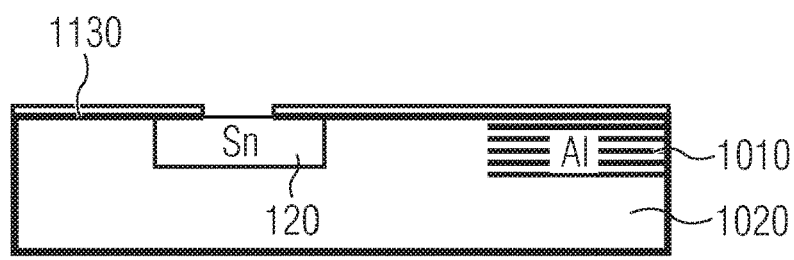
Figure 11D:
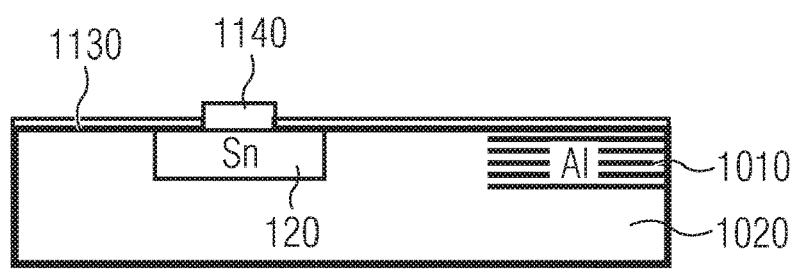
Figure 11E:
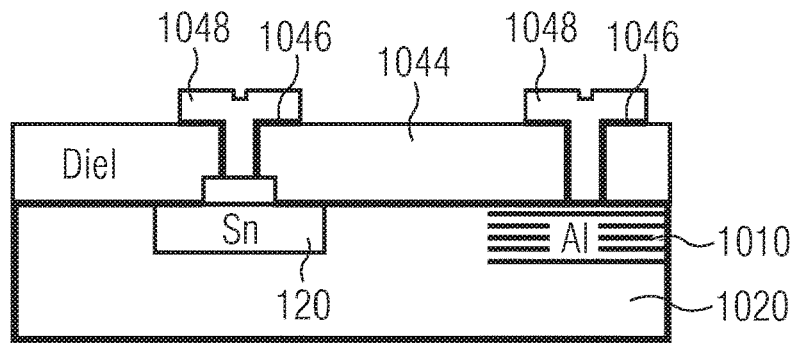

FIG. 11A-11E show schematic cross sections of a part of an electrical device at different stages of another manufacturing process according to an example. A tin Sn pad 120 of an electrical component (e.g. semiconductor device, IPD or SMD) and an aluminum Al pad 1010 of the same or another electrical component is embedded in or surrounded by an electrical insulating structure 1020 (e.g. molding compound, passivation structure and/or inorganic insulating material as oxide or nitride) of a mutual package. A carbon hard mask layer 1130 is formed (e.g. at the surface of the pads and the electrical insulating structure). Further, a resist layer 1034 (e.g. photo resist) is formed and structured to define one or more regions for forming a diffusion barrier structure as shown in FIG. 11A. Then, the carbon of the carbon hard mask layer 1130 is structured by a plasma etch process as shown in FIG. 11B. FIG. 11C shows stripping of the resist 1034. Then, a nickel layer 1140 is formed over the uncovered metal regions (Sn pad) by an eless nickel plating process as shown in FIG. 11D. Further, the carbon hard mask is removed and an RDL formation is performed as shown in FIG. 11E. For example, a dielectric layer 1044 is deposited, exposed during a lithography process and cured in order to obtain holes for the implementation of vertical extensions of the redistribution layer to form vertical connections. Further, a diffusion barrier layer 1046 and a copper redistribution layer 1048 are formed and structured by a redistribution layer RDL process block.

FIG. 11A-11E may show a possible process flow for a robust Cu-RDL-contact on Sn- and Al-Pad in parallel implemented by one eless plated nickel barrier as diffusion barrier block.

More details and aspects are mentioned in connection with the examples described above or below. The example shown in FIG. 11A-E may comprise one or more optional additional features corresponding to one or more aspects mentioned in connection with the proposed concept or one or more examples described above (e.g. FIG. 1-10) or below.

Some examples relate to a Robust RDL contact to solder pad (e.g. Sn-pad). The proposed concept may be implemented for FO-panel, FO-WLP and/or SMD and may improve the Package Reliability. The proposed concept may be implemented in high volume architectures as computer system architecture features & interfaces made in high volumes, may encompass IA (integrated architectures), devices (e.g. transistors) and associated manufacturing (mfg) processes, for example. For example, through silicon vias TSV, the design of L1 interface or first level interconnects, bumpless build-up layers BBUL and/or special designed interconnects (e.g. common system interface CSI, quick path interconnect QPI and/or Keizer Technology Interface KTI) may be enabled based on the proposed concept.

For example, an additional conductive diffusion barrier block under a Cu-RDL (via+lines) may be introduced to avoid long-range Sn-diffusion into Cu-RDL and Cu diffusion into Sn. The diffusion barrier block can have a geometry which avoids diffusion paths into the RDL-Cu region.

The proposed concept may offer more options for passive component integration into packages with Cu-RDL like FO-WLB or WLCSP, which may lead to lower component costs, for example.

In the following, some examples are described. Example 1 is an electrical device comprising a redistribution layer structure, an inter-diffusing material contact structure and a vertical electrically conductive structure located between the redistribution layer structure and the inter-diffusing material contact structure, wherein the vertical electrically conductive structure comprises a diffusion barrier structure located adjacently to the inter-diffusing material contact structure, wherein the diffusion barrier structure and the redistribution layer structure comprise different lateral dimensions.

In example 2, the subject matter of example 1 can optionally include the redistribution layer structure comprising a low-ohmic redistribution layer comprising mainly copper or silver.

In example 3, the subject matter of example 1 or 2 can optionally include the inter-diffusing material contact structure comprising a material with a melting temperature of less than 400° C. in contact with the diffusion barrier structure.

In example 4, the subject matter of examples 1-3 can optionally include the inter-diffusing material contact structure comprising a tin-based alloy or an indium based alloy in contact with the diffusion barrier structure.

In example 5, the subject matter of examples 1-4 can optionally include the diffusion barrier structure comprising a thickness of more than 500 nm.

In example 6, the subject matter of examples 1-5 can optionally include the diffusion barrier structure comprising at least one diffusion barrier layer and one copper or silver layer.

In example 7, the subject matter of example 6 can optionally include the copper or silver layer of the diffusion barrier structure comprising a thickness of less than 500 nm.

In example 8, the subject matter of examples 6-7 can optionally include the at least one diffusion barrier layer of the diffusion barrier structure being a titanium-tungsten layer.

In example 9, the subject matter of examples 6-8 can optionally include the diffusion barrier structure comprising a layer stack of alternating diffusion barrier layers and copper or silver layers.

In example 10, the subject matter of examples 6-9 can optionally include a volume of copper or silver of a lowermost copper or silver layer of the diffusion barrier structure located between a lowermost diffusion barrier layer and an opposite diffusion barrier layer being less than $1*10-4$ cm$^3$ per cm$^2$.

In example 11, the subject matter of examples 1-5 can optionally include the diffusion barrier structure comprising a nickel based layer.

In example 12, the subject matter of examples 1-11 can optionally include the redistribution layer structure comprising a diffusion barrier layer and a low-ohmic redistribution layer.

In example 13, the subject matter example 12 can optionally include the diffusion barrier structure being arranged between the diffusion barrier layer of the redistribution layer structure and the inter-diffusing material contact structure to avoid a direct interface between the diffusion barrier layer of the redistribution layer structure and the inter-diffusing material contact structure.

In example 14, the subject matter of examples 12-13 can optionally the diffusion barrier layer and the low-ohmic redistribution layer of the redistribution layer structure comprising equal lateral dimensions.

In example 15, the subject matter of examples 1-14 can optionally include the diffusion barrier structure being structured independent from the redistribution layer structure to implement the different lateral dimensions of the diffusion barrier structure and the redistribution layer structure.

In example 16, the subject matter of examples 1-15 can optionally include a surface roughness of a surface of the inter-diffusing material contact structure located adjacently to the diffusion barrier structure being higher than a surface roughness of a surface of the diffusion barrier structure located adjacently to the redistribution layer structure.

In example 17, the subject matter of examples 1-16 can optionally include an upper part of the vertical electrically conductive structure being formed by a vertical extension of the redistribution layer structure.

In example 18, the subject matter of example 17 can optionally include a lateral dimension of the barrier layer structure being larger than a lateral dimension of the upper part of the vertical electrically conductive structure.

In example 19, the subject matter of example 17 or 18 can optionally include an outside portion of a footprint of the upper part of the vertical electrically conductive structure being located outside of a footprint of the diffusion barrier structure and outside a footprint of the inter-diffusing material contact structure.

In example 20, the subject matter of examples 1-19 can optionally include the diffusion barrier structure laterally covering the whole inter-diffusing material contact structure.

In example 21, the subject matter of examples 1-20 can optionally include a second contact structure comprising a material different from a material of the inter-diffusing material contact structure, wherein a vertical extension of the redistribution layer structure is in contact with the second contact structure.

In example 22, the subject matter of example 21 can optionally include the second contact structure comprising aluminum at a surface in contact with the vertical extension of the redistribution layer structure.

In example 23, the subject matter of examples 21-22 can optionally include the inter-diffusing material contact structure forming a contact interface of a first electrical device component and the second contact structure forms a contact interface of a second electrical device component arranged in a mutual package.

In example 24, the subject matter of examples 1-23 can optionally include the redistribution layer structure connecting the inter-diffusing material contact structure to an externally accessible contact interface or another internal contact interface.

In example 25, the subject matter of examples 1-24 can optionally include the inter-diffusing material contact structure forming a contact interface of a device selected from the group comprising a semiconductor device, an integrated passive device and a surface mountable device.

In example 26, the subject matter of examples 1-25 can optionally include the inter-diffusing material contact structure forming a contact interface of a device selected from the group comprising a CPU, a memory device, a transmitter device, a receiver device, a transceiver device, a capacitor and an inductor.

In example 27, the subject matter of examples 1-26 can optionally include the redistribution layer structure being a redistribution layer structure of a fan-out wafer-level package, a fan-out panel package or a wafer level chip scale package.

Example 28 relates to a method for forming an electrical device, the method comprising forming a diffusion barrier structure adjacently to an inter-diffusing material contact structure based on a first structuring process and forming a redistribution layer structure in contact with the diffusion barrier structure based on a second structuring process independent from the first structuring process, wherein the diffusion barrier structure and the redistribution layer structure comprise different lateral dimensions structured by the two independent structuring processes.

In example 29, the subject matter of example 28 can optionally include forming the diffusion barrier structure comprising forming at least one diffusion barrier layer and forming at least one copper or silver layer.

In example 30, the subject matter of example 29 can optionally include the at least one diffusion barrier layer being a titanium-tungsten layer.

In example 31, the subject matter of example 28 can optionally include forming the diffusion barrier structure comprising forming a nickel based layer.

In example 32, the subject matter of example 31 can optionally include forming the diffusion barrier structure further comprising forming a palladium-nickel based seed layer on the inter-diffusing material contact structure before forming the nickel based layer.

In example 33, the subject matter of example 31 or 32 can optionally include the nickel based layer being formed by an electroless plating process.

In example 34, the subject matter of examples 31-33 can optionally include the redistribution layer structure comprising a diffusion barrier layer and a low-ohmic redistribution layer comprising mainly copper or silver.

In example 35, the subject matter of examples 28-34 can optionally include the inter-diffusing material contact structure comprising a material with a melting temperature of less than 400° C. in contact with the diffusion barrier structure.

In example 36, the subject matter of examples 28-35 can optionally include the inter-diffusing material contact structure comprising a tin-based alloy or an indium based alloy in contact with the diffusion barrier structure.

Example 37 is a machine readable storage medium including program code, when executed, to cause a machine to perform the method of example 28.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. An electrical device comprising:
a redistribution layer structure;
an inter-diffusing material contact structure; and
a vertical electrically conductive structure located between the redistribution layer structure and the inter-diffusing material contact structure,
wherein the vertical electrically conductive structure comprises a diffusion barrier structure located adjacently to the inter-diffusing material contact structure,
wherein the diffusion barrier structure and the redistribution layer structure comprise different lateral dimensions.

2. The electrical device according to claim 1, wherein the redistribution layer structure comprises a low-ohmic redistribution layer comprising mainly copper or silver.

3. The electrical device according to claim 1, wherein the inter-diffusing material contact structure comprises a material with a melting temperature of less than 400° C. in contact with the diffusion barrier structure.

4. The electrical device according to claim 1, wherein the inter-diffusing material contact structure comprises a tin-based alloy or an indium based alloy in contact with the diffusion barrier structure.

5. The electrical device according to claim 1, wherein the diffusion barrier structure comprises a thickness of more than 500 nm.

6. The electrical device according to claim 1, wherein the diffusion barrier structure comprises at least one diffusion barrier layer and one copper or silver layer.

7. The electrical device according to claim 6, wherein the copper or silver layer of the diffusion barrier structure comprises a thickness of less than 500 nm.

8. The electrical device according to claim 6, wherein the at least one diffusion barrier layer of the diffusion barrier structure is a titanium-tungsten layer.

9. The electrical device according to claim 6, wherein the diffusion barrier structure comprises a layer stack of alternating diffusion barrier layers and copper or silver layers.

10. The electrical device according to claim 6, wherein a volume of copper or silver of a lowermost copper or silver layer of the diffusion barrier structure located between a lowermost diffusion barrier layer and an opposite diffusion barrier layer is less than $1*10^{-4}$ cm$^3$ per cm$^2$.

11. The electrical device according to claim 1, wherein the diffusion barrier structure comprises a nickel based layer.

12. The electrical device according to claim 1, wherein the redistribution layer structure comprises a diffusion barrier layer and a low-ohmic redistribution layer.

13. The electrical device according to claim 12, wherein the diffusion barrier structure is arranged between the diffusion barrier layer of the redistribution layer structure and the inter-diffusing material contact structure to avoid a direct interface between the diffusion barrier layer of the redistribution layer structure and the inter-diffusing material contact structure.

14. The electrical device according to claim 12, wherein the diffusion barrier layer and the low-ohmic redistribution layer of the redistribution layer structure comprise equal lateral dimensions.

15. The electrical device according to claim 1, wherein the diffusion barrier structure is structured independent from the redistribution layer structure to implement the different lateral dimensions of the diffusion barrier structure and the redistribution layer structure.

16. The electrical device according to claim 1, wherein a surface roughness of a surface of the inter-diffusing material contact structure located adjacently to the diffusion barrier structure is higher than a surface roughness of a surface of the diffusion barrier structure located adjacently to the redistribution layer structure.

17. The electrical device according to claim 1, wherein an upper part of the vertical electrically conductive structure is formed by a vertical extension of the redistribution layer structure.

18. The electrical device according to claim 17, wherein a lateral dimension of the diffusion barrier structure is larger than a lateral dimension of the upper part of the vertical electrically conductive structure.

19. The electrical device according to claim 17, wherein an outside portion of a footprint of the upper part of the vertical electrically conductive structure is located outside of a footprint of the diffusion barrier structure and outside a footprint of the inter-diffusing material contact structure.

20. The electrical device according to claim 1, wherein the diffusion barrier structure laterally covers the whole inter-diffusing material contact structure.

21. The electrical device according to claim 1, further comprising a second contact structure comprising a material different from a material of the inter-diffusing material contact structure, wherein a vertical extension of the redistribution layer structure is in contact with the second contact structure.

22. The electrical device according to claim 21, wherein the second contact structure comprises aluminum at a surface in contact with the vertical extension of the redistribution layer structure.

23. A method for forming an electrical device, the method comprising:

forming a diffusion barrier structure adjacently to an inter-diffusing material contact structure based on a first structuring process; and forming a redistribution layer structure in contact with the diffusion barrier structure based on a second structuring process independent from the first structuring process and after the first structuring process, wherein the diffusion barrier structure and the redistribution layer structure comprise different lateral dimensions structured by the two independent structuring processes.

24. The electrical device according to claim 23, wherein forming the diffusion barrier structure comprises forming at least one diffusion barrier layer and forming at least one copper or silver layer.

25. The electrical device according to claim 23, wherein forming the diffusion barrier structure comprises forming a nickel based layer.

* * * * *